United States Patent [19]

Takeuchi et al.

[11] Patent Number: 4,949,242
[45] Date of Patent: Aug. 14, 1990

[54] MICROCOMPUTER CAPABLE OF ACCESSING CONTINUOUS ADDRESSES FOR A SHORT TIME

[75] Inventors: Kazuhiro Takeuchi; Shigetatsu Katori, both of Tokyo, Japan

[73] Assignee: Nec Corporation, Tokyo, Japan

[21] Appl. No.: 268,330

[22] Filed: Nov. 4, 1988

[30] Foreign Application Priority Data

Nov. 4, 1987 [JP] Japan .............................. 62-278823

[51] Int. Cl.⁵ .............................................. G06F 12/00
[52] U.S. Cl. .................................... 364/200; 364/231; 364/232.8; 364/239; 364/239.4
[58] Field of Search .................. 364/200, 900

[56] References Cited

U.S. PATENT DOCUMENTS 4,797,851  1/1989  Suzuki ............................ 364/900

Primary Examiner—Raulfe B. Zache
Attorney, Agent, or Firm—Foley & Lardner, Schwartz, Jeffery, Schwaab, Mack, Blumenthal & Evans

[57] ABSTRACT

A microcomputer comprises a microprocessor chip and a memory chip coupled to each other. The memory chip includes a memory for storing various processing data, a bus interface for designating an address information of the memory to be accessed for a data transfer, and an address latch for temporarily holding the address information from the bus interface and so as to supply the address information to the memory. Furthermore, there is provided an automatically updated data pointer whose initial value is set with the address information supplied from the bus interface. In case of individually designating an address for each item of data to be transferred, the address latch is used to supply the address information to the memory so that an address is given to the address latch by the bus interface for each data transfer of one unitary data. In the case of continuously designating an address for each item of data to be transferred, so that the data pointer is used to supply the address information to the memory so that an address for the data transfer of a first unitary data to be transferred is given to the data pointer and then the data pointer is automatically updated for each of the second and succeeding data transfers.

10 Claims, 7 Drawing Sheets

MICROCOMPUTER CAPABLE OF ACCESSING CONTINUOUS ADDRESSES FOR A SHORT TIME

BACKGROUND OF THE INVENTION

1. Field of the Invention

The present invention relates to a microcomputer, and more specifically to a microcomputer effective in handling a volume of data having continuous addresses.

2. Description of Related Art

At present, microcomputers can process given instructions at a very high speed because of improved architecture. However, in the case that the microcomputer reads data from a memory or writes data to a memory, the access speed to the memory is not so high and not comparable to the instruction processing speed of the microcomputer. This is one large cause decreasing the instruction execution speed of the microcomputer.

In general, for example, microcomputers use a read/write bus cycle consisting of three basic operation states. In a first basic operation state of each read/write bus cycle, an address latch enable signal is activated so that an address latch can latch an address on an address bus. In a period from the first basic operation state to a second basic operation state of each read/write bus cycle, the microcomputer outputs an address to the address bus. Thereafter, in a third basic operation state of each read/write bus cycle, the microcomputer reads data from the memory or write data to the memory.

In the case of searching or writing a large volume of data on a continuous address area, therefore, an address must be supplied to the address bus for each item of data. As a result, if the amount of data to be handled is increased, a total time used for a required number of read/write cycles is inevitably increased. In ordinary cases, for a time of period in which an address is being supplied to the bus, the microcomputer is put in a data waiting condition. Therefore, if a large amount of data is to be reference in the search processing, the wait time of the microcomputer will be increased in proportion to the amount of data to be referenced, with the result that the processing capacity of the microcomputer is greatly decreased.

SUMMARY OF THE INVENTION

Accordingly, it is an object of the present invention to provide a microcomputer which has overcome the above mentioned defect of the conventional one.

Another object of the present invention is to provide a microcomputer capable of decreasing the total time used for read/write cycles of data, so as to increase the processing speed of the microcomputer.

A further object of the present invention is to provide a microcomputer capable of accessing a volume of data having continuous addresses for a short time of period.

The above and other objects of the present invention are achieved in accordance with the present invention by a microcomputer comprising memory means for storing various processing data, control means for designating an address of the memory means to be accessed for data transfer, so as to control a data transfer to and from the memory means, first and second indication means for holding the address output from the control means, updating means coupled to the second indication means to update the address stored in the second indication means, and data transfer means for accessing a predetermined address of the memory means indicated by the first or second indication means for data transfer, the control means operating to cause the first indication means to supply the address to the memory means in case of individually designating an address for each item of data to be transferred, so that an address is given to and from the first indication means for each data transfer of one unitary data, and to cause the second indication means to supply the address to the memory means in the case of continuously designating an address for each item of data to be transferred, so that an address is given to the second indication means only for the data transfer of a first unitary data to be transferred and then the second indication means is automatically updated by the updating means for each of the second an succeeding data transfers.

With the above mentioned arrangement, in the case of transferring various data to discontinuous addresses of the memory, or in the case of transferring data from discontinuous address of the memory to a data processing means such as the microcomputer, the control means selects the first indication means. In addition, address information is give to the first indication means for each data transfer of one unitary data. Thus, the data transfer means or reads out data from an address of the memory designated by the first indication means.

On the other hand, in the case of transferring various data to continuous addresses of the memory, or in the case of reading data from continuous addresses of the memory, the control means selects the second indication means. In additon, address information is given to the second indication means for a first data transfer of one unitary data, and the second indication means is automatically updated by the updating means each time the data is transferred. Thus, no address information is given from the control means for the second and succeeding data transfers, but the address information given to the memory is sequentially updated to the addresses to be data-transferred. As a result, the data transfer means transfers or reads out data from an address of the memory designated by the second indication means. Accordingly, it is possible to remove a time for designating an address to the second indication means for the second and succeeding data transfers, and therefore, it is possible to greatly decrease the data transfer processing time of the microcomputer.

The above and other objects, features and advantages of the present invention will be apparent from the following description of preferred embodiments of the invention with reference to the accompanying drawings.

DESCRIPTION OF THE PREFERRED EMBODIMENTS

Figure 1:
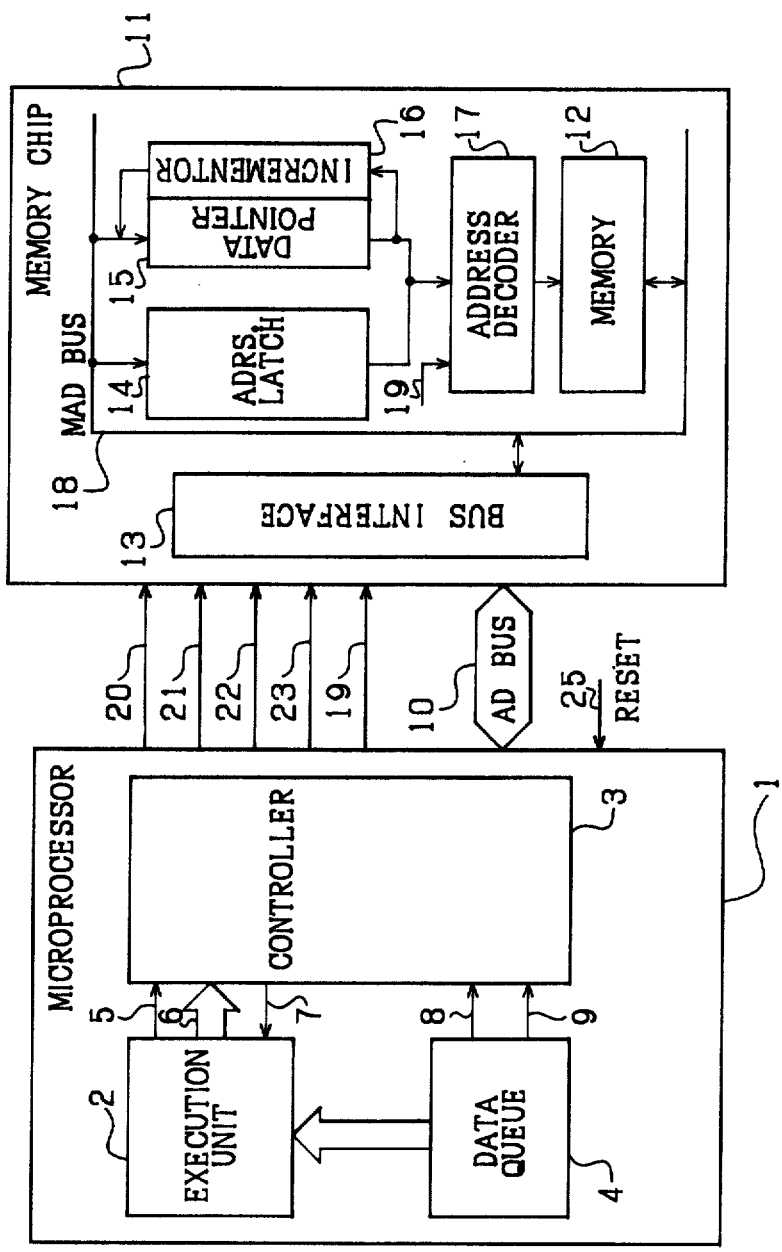
FIG. 1 is a block diagram of an embodiment of the microcomputer in accordance with the present invention.

Referring to FIG. 1, there is shown in a diagram of an embodiment of the microcomputer in accordance with the present invention. The shown microcomputer includes microprocessor chip 1 for performing a data input/output processing, an arithmetic and logic operation, and a control for the whole of the microcomputer system. The microcomputer also includes a memory chip 11 including a memory 12 storing data used when the microprocessor executes a program.

The microprocessor 1 includes an executing unit 2 for executing an instruction, a controller 3 for controlling the overall operation of the microprocessor, and a data queue 4 coupled to the execution unit for temporarily storing data from the memory chip 11.

The execution unit 2 outputs a bus request signal 5 and an address signal through an address signal line 6 to the controller 3. The bus request signal 5 is for requesting a start of a data read/write cycle to the memory 12 of the memory chip 11 as the result of the instruction execution. The address signal line 6 is for transferring an address information of a location of the memory 12 to be accessed. The controller 3 reponds to the request for a start of a data read/write cycle and output an acknowledge signal 7 to the execution unit 2.

The data queue 4 generates a queue ready signal 8 indicating that a suitable amount of data is stored in the queue and the stored data is readable, and a queue full signal 9 indicating that the queue is filled with stored data. These signals are supplied to the controller 3.

The microprocessor chip 1 is coupled to the memory chip 11 through an address/data (AD) bus 10, on which address information and data are transferred in a multiplexed form. A reading/writing of data between the microprocessor 1 and the memory 12 is performed through the AD bus 10.

On the other hand, the memory chip 11 includes a bus interface 13 for controlling the operation of the memory chip 11 on the basis of various signals mentioned hereinafter output from the microprocessor 1, so that data is written to or read from a predetermined address of the memory. There is provided an address latch 14 which demultiplexes the multiplexed address information and data supplied through the AD bus 10 so as to output the address information to an address decoder 17. A data pointer (DP) 15 is input with an address information for the memory 12 where there is stored data to be processed by the microprocessor or to which data is to be stored. The data pointer 15 outputs the address information to the address decoder 17. An incrementer 16 is associated to the data pointer 15 so as to increment the address information output from the data pointer 15 to the address decoder 17 and to rewrite to the data pointer 15 the incremented address information.

The address decoder 17 receives either the output of the address latch 14 or the output of the data pointer 15 on the basis of a control signal mentioned hereinafter, and selects a cell or cells of the memory 12 in accordance with the received address information. In the case of writing, data from the microprocessor is stored at the cell or cells of the memory 12 selected by the address decoder 17.

The above mentioned elements included in the memory chip 11 are coupled to a memory address/data bus (MAD) 18.

Explanation will be made on control signals input to or output from the microprocessor 1 and the memory chip 11.

To the microprocessor 1 there is input a reset signal 25 for initializing hardware included in the microprocessor 1. On the other hand, the microprocessor 1 generates an address latch enable (ALE) signal 20, a read (RD) signal 21, a write (WR) signal 22, a data read control (DRC) signal 23, and an address source selection (A/D) signal 19, respectively, which are input as control signals to the memory chip 11.

Specifically, the ALE signal 20 defines the timing at which the address latch 14 latches the address information on the MAD bus 18. The Rd signal 21 gives a timing at which the microprocessor 1 reads out data from the memory 12 in the memory chip 11. On the other hand, the WR signal 22 gives a timing at which the data is written to the memory 12. For the purpose of reading or writing continuous data, the DRC signal 23 defines a timing at which the output of the data pointer 15 is incremented by the incrementer 16 and the incremented result is written to the data pointer 15. The A/D signal 19 indicates which of the output of the address latch 14 of the data pointer 15 should be decoded by the address decoder 17. Incidentally, the RD signal 27 and the WR signal 22 are active at a low level. If the A/D signal 19 is at a high level, the content of the data pointer 15 is decoded by the address decoder 17, and if the A/D signal 19 is at a low level, the content of the address latch 14 is decoded by the address decoder 17. In addition, the data pointer 15 is updated in synchronism with a rising edge of the DRC signal 23.

Figure 2:
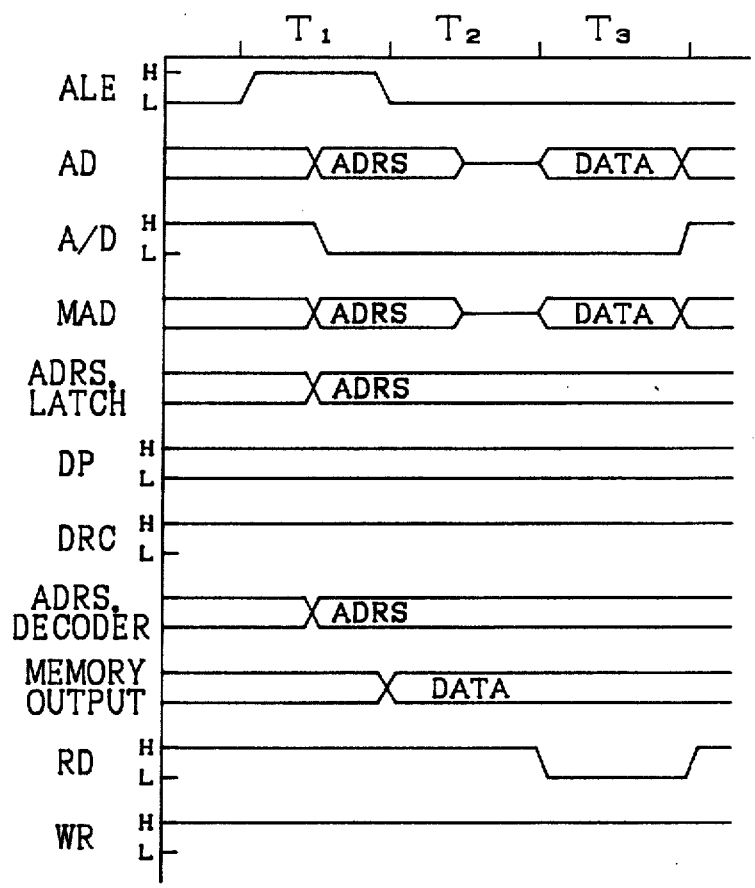
FIGS. 2 to 5 are timing charts illustrating various operations of the microcomputer shown in FIG. 1.
Figure 3:
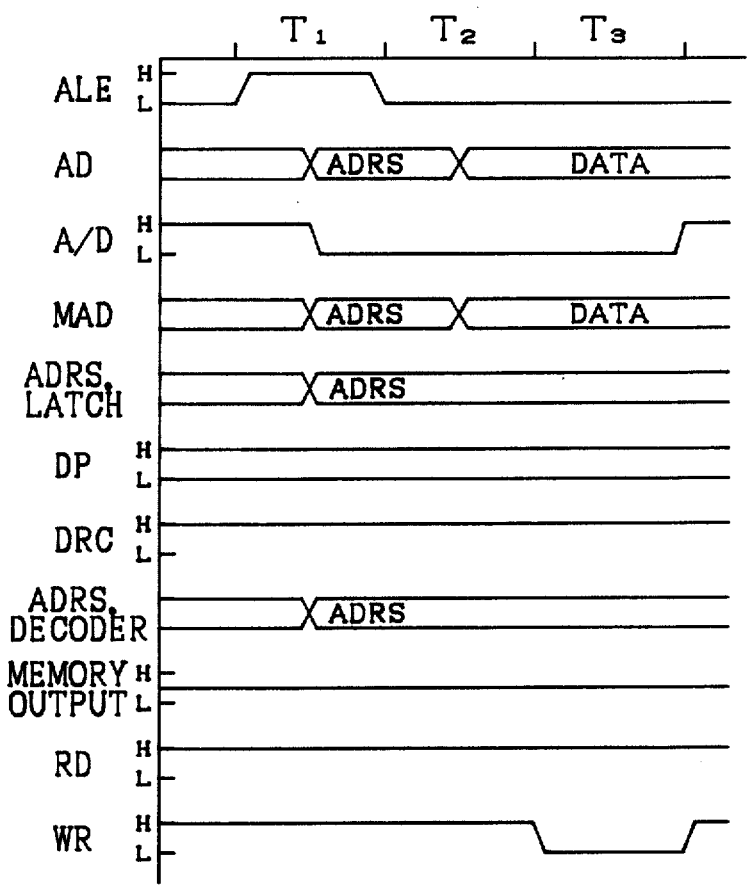

The microcomputer having the above mentioned construction will operate as follows: First, explanation will be made on the case of a single data transfer (called "discontinuous data transfer" hereinafter). FIGS. 2 and 3 illustrate timing charts of the bus cycle in the case of the discontinuous data transfer. A bus cycle of the microprocessor 1 is fundamentally composed of three basic operation states $T_1$, $T_2$ and $T_3$, each formed of a plurality of clocks, and an empty states. Therefore, the controller 3 generates three basic timing signals for defining the three basic operation states and an idle (TI) signal indicating that the bus cycle is in the empty state. On the basic timing signals thus generated, the controller 3 generates the various control signals for the memory chip 11. The bus cycle for the data read/write processing to the memory 12 performed by the execution of the instruction, is controlled by the various control signals.

The data read/write cycle is composed of the basic operation states $T_1$, $T_2$ and $T_3$. In the case of the discontinuous data transfer, the controller 3 will rise up the ALE signal 20 at the start timing of the basic operation state $T_1$ so that the bus interface 13 causes the address latch 14 to open its input gate. Namely, an address information on the MAD bus 18 is input to the address latch 14.

Then, in order to avoid a conflict between the current bus cycle and the preceding bus cycle, the controller 3 outputs an address information output on the address lines 6 by the execution unit 2, to the AD bus 10, in a latter half of the basic operation state $T_1$. At the same time, the controller 3 brings the A/D signal 19 to the low level. With this, the output of the address latch 14 is selected as the address information decoded by the address decoder 17. Therefore, since the address information on the AD bus 10 is output to the MAD bus 18, the address information on the AD bus 10 is input to the address decoder 17 through the MAD bus 18 and the address latch 14.

Thereafter, the controller 3 falls downs the ALE signal 20 at the trailing edge of the basic operation state $T_1$. With this, the bus interface 13 closes the input gate of the address latch 14 so that the address information on the MAD bus 18 is latched in the address latch 14.

In the case of the data read cycle shown in FIG. 2, the controller 3 brings the AD bus 10 in a floating condition at a latter half of the basic operation state $T_2$ in order to be ready for the read operation. Then, the controller 3 activates the RD signal 21 for a period of the basic operation state $T_3$. As a result, the bus interface 13 outputs data at a location of the memory 12 indicated by the address information latched in the address latch 14, to the AD bus 10 through the MAD bus 18. Then, the controller 3 reads the data on the AD bus 10 at a predetermined clock within the basic operation state $T_3$, for a period of which the data on the AD bus 10 is effective.

On ther other hand, in the case of the data write cycle shown in FIG. 3, the controller 3 outputs a write data on the AD bus 10 at a latter half of the basic operation state $T_2$. This write data is input to the MAD bus 18 of the memory chip 11. Then, the controller 3 activates the WR signal 22 for a period of the basic operation state $T_3$. As a result, he bus interface 13 writes the data on the MAD bus 18 to a location of the memory 12 indicated by the address information latched in the address latch 14, at a trailing edge of the basic operation state $T_3$, at which the data on the AD bus 10 is effective.

As mentioned above, in the data read/write cycle of the discontinuous data transfer, the controller 3 maintains the A/D signal 19 at a low level so that the bus interface 13 causes the address decoder 17 to select the output of the address latch 14 as the address information for the memory 12.

Figure 4:
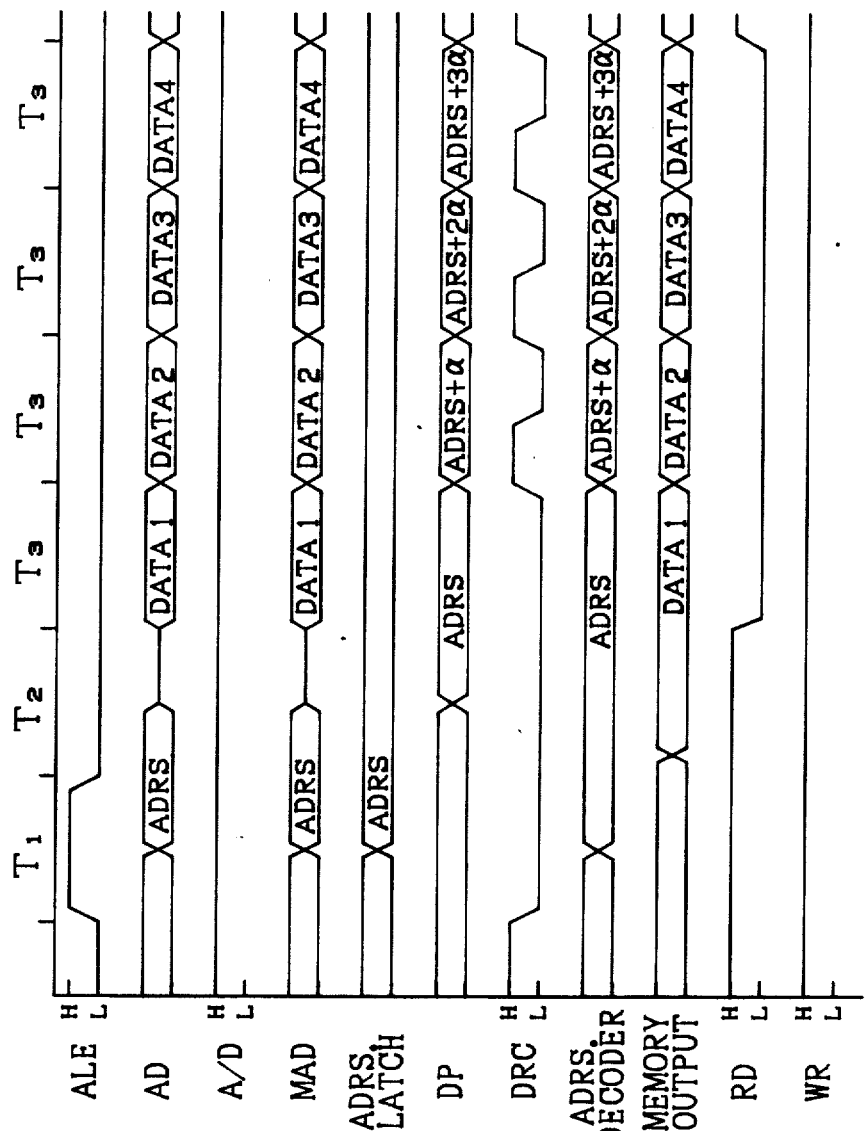

Now, explanation will be made on an operation of the microcomputer in the case of a continuous data transfer, with reference to timing charts shown in FIGS. 4 and 5. The data read/write cycle is fundamentally composed of three basic operation states, i.e., the basic operation state $T_1$ and the basic operation state $T_2$ and also the continuous basic operation state $T_3$.

In the case of the continuous data transfer, the ALE signal 20 is risen up at the leading edge of the basic operation state $T_1$, similarly to the case of the discontinuous data transfer. In addition, the DRC signal 23 for controlling the data pointer 15 and the incremented 16 in the memory chip 11 is falled down.

Then, the controller 3 maintains the A/D signal 19 at a high level so that the output of the data pointer 15 is selected by the address decoder 17, and thereafter, falls down the ALE signal 20 at the trailing edge of the basic operation state $T_1$.

In the data read cycle shown in FIG. 4, the controller 3 brings the AD bus 10 into a floating condition at a later half of the basic operation state $T_2$, in order to be ready for read operation. For a period of the basic operation state $T_3$, the RD signal 21 is activated, so taht the bus interface 13 outputs the data stored in the memory 12 and indicated by the address information of the data pointer 15, to the AD bus 10 through the MAD bus 18. The controller 3 reads the data on the AD bus 10 at a predetermined clock within the basic operation state $T_3$, for a period of which the data on the AD bus 10 is effective.

Furthermore, at the trailing edge of the basic operation state $T_3$, the DRC signal 23 is risen up so that the content of the data pointer 15 is updated by the incrementer. As a result, a next address is supplied to the address decoder 17. With this, in a succeeding basic operation state $T_3$, the bus interface 13 outputs the data stored in the memory 12 and indicated by the address information of the data pointer 15, to the AD bus 10 through the MAD bus 18. On the other hand, the controller 3 falls down the DRC signal 23 in the midway of the same basic operation state $T_3$.

As mentioned above, by rising and then falling the DRC signal 23 within a period of each basic operation state $T_3$, the content of the data pointer is sequentially updated, and therefore, the data can be continuously read. A termination of the data read is transferred to the bus interface 13, by the fact that the controller 3 inactivates the RD signal 21. In response to the inactive RD signal, the bus interface 13 terminates the read operation.

Figure 5:
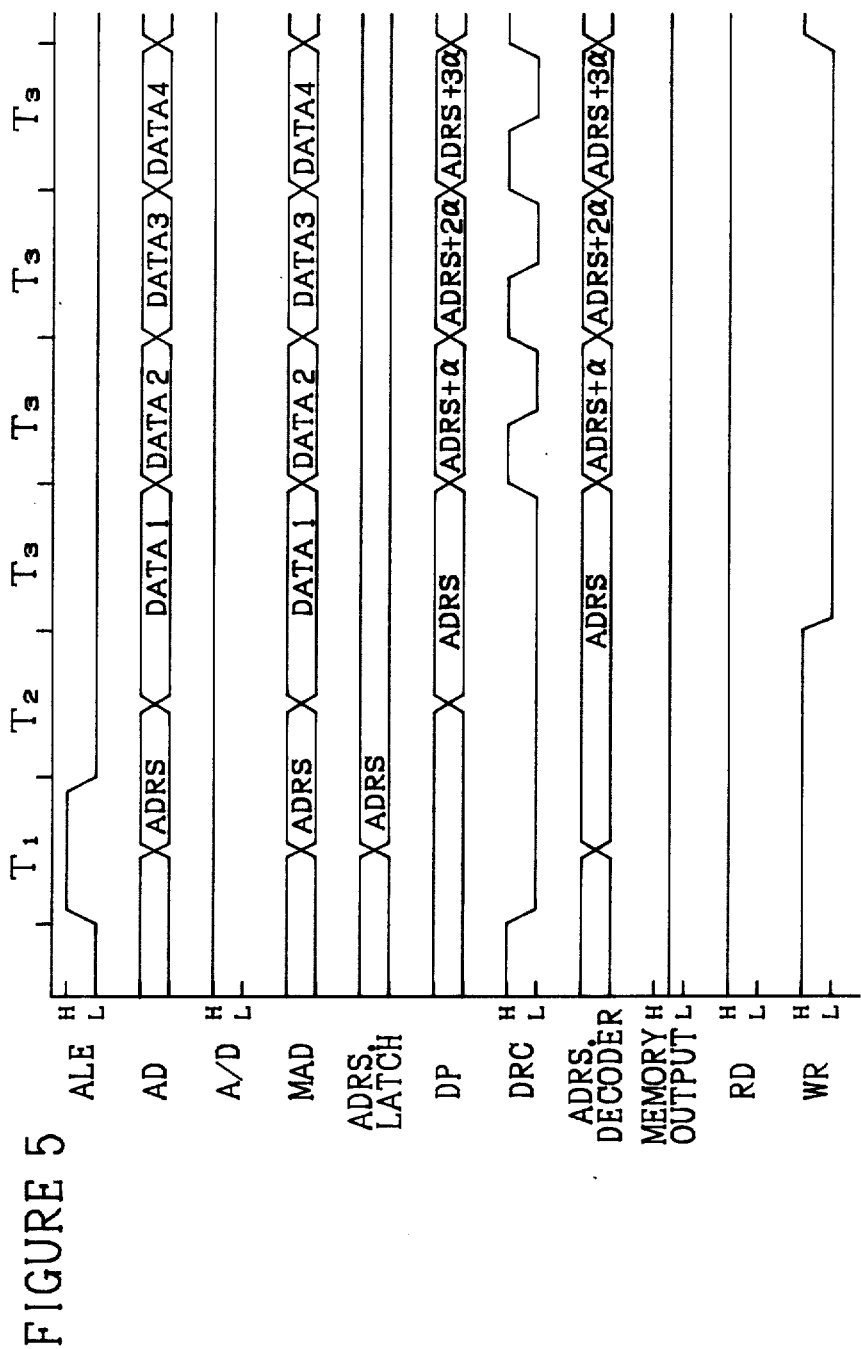

In the data write cycle shown in FIG. 5, on the other hand, the controller 3 outputs a write data to the AD bus 10 at a latter half of the basic operation state $T_2$. For a period of the succeeding basic operation state $T_3$, the WR signal 22 is activated, so that the bus interface 13 writes the data on the MAD bus 18 to an address of the memory 12 indicated by the address information of the data pointer 15, in synchronism with the rising edge of the DRC signal 23 within a period of the basic operation state $T_3$, for which the data on the AD bus 10 is effective.

Furthermore, at the trailing edge of the basic operation state $T_3$, the DRC signal 23 is risen up so the content of the data pointer 15 is updated. As a result, a next address is supplied to the address decoder 17. With this, at a start timing of a succeeding basic operation state $T_3$, the bus interface 13 writes the data supplied through the AD bus 10, to an address of the memory 12 indicated by the address information of the data pointer 15. On the other hand, the controller 3 falls down the DRC signal 23 in the midway of the same basic operation state $T_3$.

As mentioned above, by rising ad then falling the DRC signal 23 within a period of each basic operation state $T_3$, the data can be continuously written. A termination of the data writing is transferred to the bus interface 13, by the fact that the controller 3 inactivates the WR signal 22. In response to the inactive WR signal, the bus interface 13 terminates the data wire operation.

Figure 6:
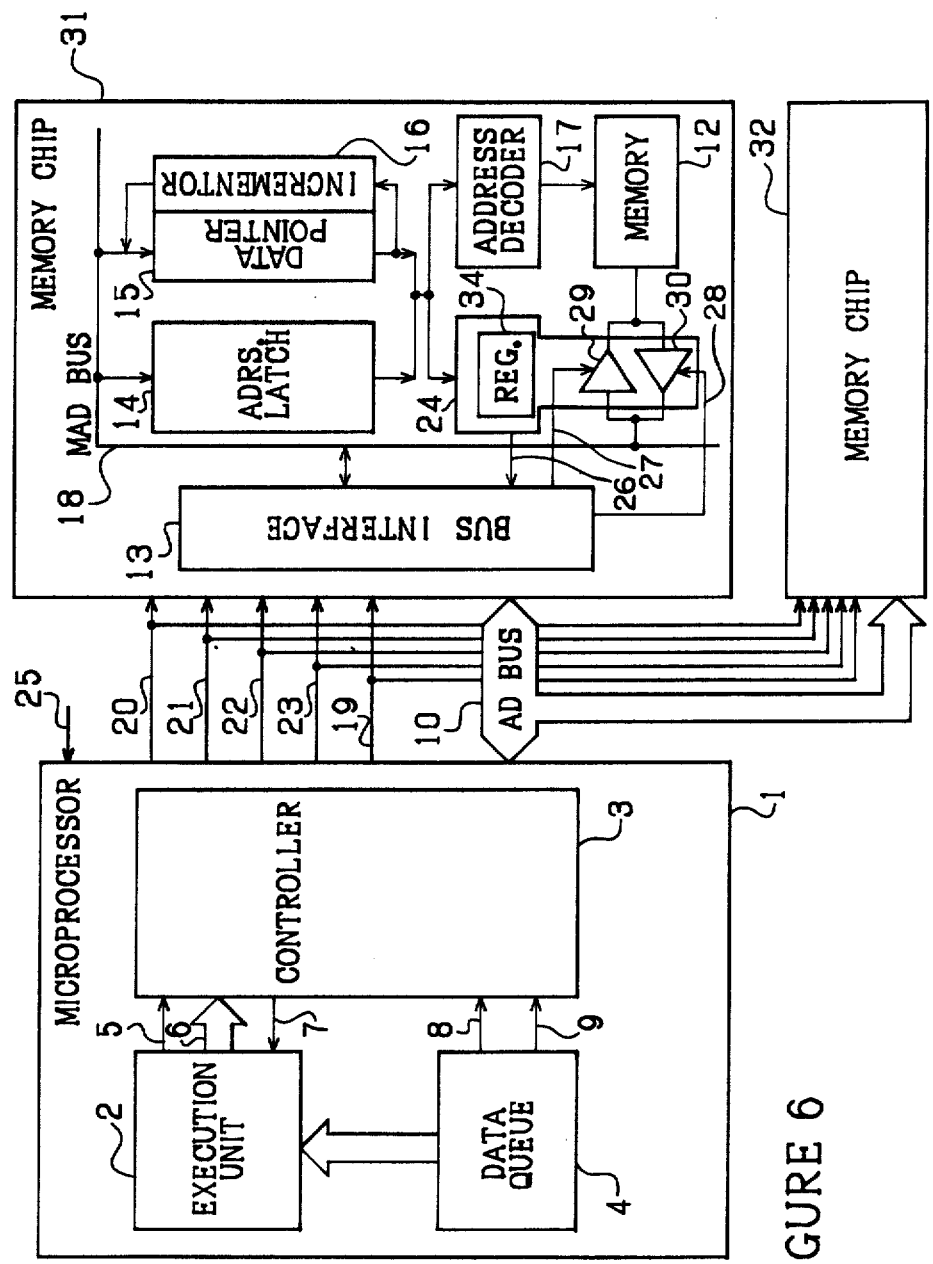
FIG. 6 is a block diagram of another embodiment of the microcomputer in accordance with the present invention.
Figure 7:
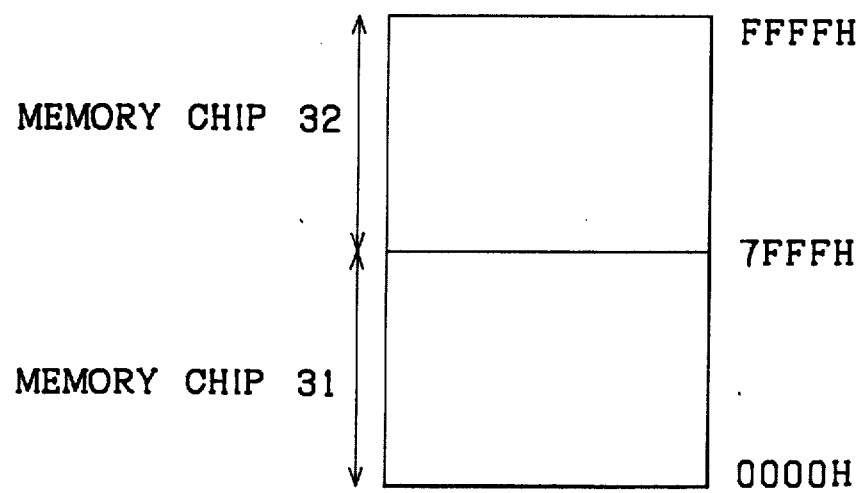
FIG. 7 illustrates an address space of the microcomputer shown in FIG. 6.

Referring to FIG. 6, there is shown a block diagram of another embodiment of the microcomputer in accordance with the present invention. In FIG. 6, elements similar to those shown in FIG. 1 are given the same Reference Numerals. One important difference between the FIG. 1 embodiment and the FIG. 6 embodiment is that the FIG. 6 embodiment has a memory space shown in FIG. 7 and realized by a pair of memory chips 31 and 32. The memory chip 31 is the same as the memory chip 11 shown in FIG. 1, except that the memory chip 31 is additionally provided with a select signal generator 24 having a register 34, a write buffer 29 and a read buffer 30. The memory chip 32 has the same construction as the memory chip 31 and is applied with the same control signals as those applied to the memory chip 31. In addition, the same AD bus 10 is coupled to the memory chips 31 and 32.

For example, the microprocesor has an address space of 64 Kbytes formed by the memory chip 31 and 32, the memory chip 31 having addresses of "0000"th to "7FFF"th (in hexadecimal notation), and the memory chip 32 having addresses of "8000"th to "FFFF"th (in hexadecimal notation). The register 34 is one bit and indicates which of the memory chips 31 ad 32 is designated by the microprocessor 1. For example, the register 34 assumes "0" for the memory chip 31 and "0" for the memory chip 32. Therefore, the following Table 1 can be obtained.

TABLE 1

|  | Value of Register 34 | Address |
|---|---|---|
| Memory Chip 32 | 1 | 8000-FFFF$_H$ |
| Memory Chip 31 | 0 | 0000-7FFF$_H$ |

The select signal generator 24 having the register 34 compares the value of the register 34 with the value of the most significant bit of the address information output from the address latch 14 or the data pointer 15, and brings a select (SL) signal 26 to a high level when both the values are consistent with each other. This SL signal 26 is input to the bus interface 13. When the SL signal 26 is at a high level, the bus interface 13 outputs a write buffer control signal 27 to the write buffer 29 and a read buffer control signal 28 to the read buffer 30, respectively. On the other hand, when the SL signal 26 is at a low level, the bus interface 13 does not output the control signals 27 and 28. When the write buffer control signal 27 is at a high level, the write buffer 29 allows data to be written to an address in the memory 12 indicated by the address decoder 27. When the read buffer control signal 28 is at a high level, the read buffer 30 allows data to be read from the address in the memory 12 indicated by the address decoder 17. The address decoder 17 receives lower place 15 bits of the address information output from the address latch 14 or the data pointer 15 so as to select a cell or cells to be accessed in the memory 12.

An operation of the above mentioned microprocessor will be explained, and a basic bus cycle for the data read/write cycle will be first described.

In the case of the discontinuous data transfer, the data read/write cycle is composed of the basic operation states $T_1$, $T_2$ and $T_3$, and the operation in the first half period of the basic operation state $T_1$ is the same as that of the first embodiment. In the data write cycle, in order to avoid a conflict between the current bus cycle and the preceding bus cycle, the controller 3 outputs an address information output on the address lines 6 by the execution unit 2, to the AD bus 10, in a latter half of the basic operation state $T_1$. At the same time, the controller 3 brings the A/D signal 19 to the low level. With this, the output of the address latch 14 is selected as the address information decoded by the address decoder 17 and input to the select signal generator 24 in each of the memory chips 31 and 32. Only the most significant bit of the address information on the AD bus 10 is input to the select signal generator 24, and lower place 15 bits of the address information on the AD bus 10 are input to the address decoder 17 through the MAD bus 18 and the address latch 14.

The select signal generator 24 compares the preset value in the register 34 ("0" in the memory chip 31 and "1" in the memory chip 32) with the most significant bit of the address latch 14. Only in the memory chip where both values are consistent, the SL signal 26 is brought into a high level. When the WR signal 22 is brough to a low level in the basic operation state $T_3$, the bus interface 13 in the memory chip generating the high level SL signal 26 brings the write buffer control signal 27 to a high level so as to turn on the write buffer 29. Thus, the data on the AD bus 10 is written to the memory 12 through the MAD bus 18.

On the other hand, in the case of the data read cycle, the controller 3 brings the A/D signal 19 to the low level, in a latter half of the basic operation state $T_1$, similar to the write cycle. The select signal generator 24 compares the value of the register 34 and the most significant bit of the address latch 14. As a result, of the memory chips 31 and 32, the memory chip in which both values are consistent will brings its SL signal 26 to a high level. The bus interface 13 in the memory chip generating the high level SL signal 26 brings the read buffer control signal 27 to a high level so as to turn on the read buffer 30. Thus, the data is transferred through the MAD bus 18 and the AD bus 10 to the execution unit 2.

Now, explanation will be made on an operation in the case of a continuous data transfer. The data read/write cycle is fundamentally composed of three basic operation states, i.e., the basic operation state $T_1$ and the basic operation state $T_2$ and also the continuous basic operation states $T_3$. The operation until the latter half of the basic operation state $T_1$ is the same as the operation in the discontinuous data transfer case of the second embodiment.

In the data write cycle, since the A/D signal 19 is at high level, the output of the data pointer 15 is designated as the address information decoded by the address decoder and input to the select signal generator decoded by the address decoder and input to the select signal generator 24. The operation in the basic operation state $T_3$ is the same as that of the first embodiment. In addition, even if the continuous data transfer should be made to pass through the boundary between the memory chips 31 and 32, the controller is required neither to instruct the change-over of the memory chip nor to second a new address. In other words, when the memory chip to be accessed is changed from one to another, only the most significant bit of the data pointer 15 is changed, so that the SL signal 26 of the memory chip which has been accessed before the change-over of the memory chip will be brought from the high level to the low level, and the SL signal 26 of the other memory chip will be brought from the low level to the high level. Namely, the memory chip is automatically interrupt.

In the data read cycle, if it is necessary to switch from one memory chip to another in the way of the data transfer, the switching is automatically performed, and the data read operation is carried out without disconnection.

Incidentally, the termination of the data read/write cycle is informed to the bus interface 13 by the fact that the RD signal 21 or the WR signal 22 is returned to the inactive level. In response to the inactive signal 21 or 22, the bus interface 13 completes the processing.

As seen from the above, the present invention is characterized in that in the case of a continuous address data transfer, the updating means will give address information for indicating the address of data which will be transferred at a second place or later. Therefore, the operation time can be reduced by a time necessary for the controller to supply the address information to the address latch (the address data wait time). Therefore, the overall time of the microcomputer system can be greatly decreased. Particularly, the present invention is very effective in the case in which a large amount of data is search or written.

The invention has thus been shown and described with reference to the specific embodiments. However, it should be noted that the present invention is in no way limited to the details of the illustrated structures but changes and modifications may be made within the scope of the appended claims.

We claim:

1. A microcomputer comprising memory means for storing various processing data, control means for designating an address of said memory means for be accessed for data transfer, so as to control a data transfer to and from the memory means, first and second indication means for holding the address output from the control means, updating means coupled to the second indication means to update the address stored in the second indication means, and data transfer means for accessing a predetermined address of the memory means indicated by the first or second indication means for data transfer, the control means operating to cause the first indication means to supply the address to the memory means in case of individually designating an address for each item of data to be transferred, so that an address is given through the first indication means from the control means for each data transfer of one unitary data, and to cause the second indication means to supply the address to the memory means in case of continuously designating an address for each item of data to be transferred, so that an address is give to the second indication means only for data transfer of a first unitary data to be transferred and then the second indication means is automatically updated by the updating means for each of second and succeeding data transfers.

2. A microcomputer claimed in claim 1 wherein the memory means includes first and second memories which form one continuous address space, each of the first and second memories having means for decoding a give address information to selective put itself in an accessible condition.

3. A microcomputer comprising a microprocessor chip and a memory chip coupled to each other, the memory chip including a memory for storing various processing data, a bust interface coupled to the microprocessor for designating an address information of the memory to be accessed for a data transfer, an address latch coupled to the bus interface for temporarily holding the address information from the bus interface and so as to supply the address information to the memory, and an automatically updated data pointer coupled to the bus interface so that an initial value is set with the address information supplied from the bus interface, the data pointer operating to supply the address information to the memory, the address latch and the data pointer being controlled in such a manner that in case of individually designating an address for each item of data to be transferred, the address latch is used to supply the address information to the memory so that an address is give to the address latch by the bus interface for each data transfer of one unitary data, and in a case of continuously designating an address for each item of data to be transferred, an address for a data transfer of a first unitary data to be transferred is given to the data pointer and then the data pointer is automatically updated for each of a second and succeeding data transfers, so that the data pointer is used to supply the address information to the memory.

4. A microcomputer claimed in claim 3 wherein the data pointer is coupled with an incrementer which receives an output of the data pointer for incrementing a received data after each data transfer and to writing the incremented data to the data pointer.

5. A microcomputer claimed in claim 3 further including an address decoder selectively receiving an output of an data latch or the output of the data pointer so as to output a decoded address data to the memory.

6. A microcomputer claimed in claim 3 including at least first and second memory chips forming one continuous address space, each of the memory chips being coupled to each other, each of the memory chips including a memory for storing various processing data, a bus interface coupled to the microprocessor and for designating an address information of the memory to be accessed for a data transfer, an address latch coupled to the bus interface for temporarily holding the address information from the bus interface and so as to supply the address information to the memory, an automatically updated data pointer coupled to the bus interface so that an initial value is set with the address information supplied from the bus interface, the data pointer operating to supply the address information to the memory, a selectively activated buffer circuit coupled between the memory and the bus interface, and a select signal generator receiving an access address information supplied from a output of an address latch or the output of the data pointer for causing the buffer circuit to be in an operating condition when access is directed to the corresponding memory, the address latch and the data pointer being controlled in such a manner that in case of individually designating an address for each item of data to be transferred, the address latch is used to supply the address information to the memory so that an address is given to the address latch by the bus interface for each data transfer of one unitary data and in the case of continuously designating an address for each item of data to be transferred, an address for the data transfer of a first unitary data to be transferred is given to the data pointer and then the data pointer is automatically updated for each of the second and succeeding data transfers, so that the data pointer is used to supply the address information to the memory.

7. A memory chip including a memory for storing various processing data, bus interface coupled to a microprocessor for designating an address information of the memory to be accessed for a data writing, an address latch coupled to the bus interface for temporarily holding the address information from the bus interface and so as to supply the address information to the memory, and an automatically updated data pointer coupled to the bus interface so that an initial value is set with the address information supplied from the bus interface, the data pointer operating to supply the address information to the memory, the address latch and the data pointer being controlled in such a manner that in case of individually designating an address for each item of data to be written, the address latch is used to supply the address information to the memory so that an address is given to the address latch by the bus interface for each data transfer of one unitary data, and in case of continuously designating an address for each item of data to be written, an address for a data transfer of a first unitary data to be transferred is given to the data pointer and then the data pointer is automatically updated for each of second and succeeding data transfers, so that the data pointer is used to supply the address information to the memory.

8. A memory chip claimed in claim 7 wherein the data pointer is coupled with an incrementer which receives an output of the data pointer for incrementing a received data after each data transfer and for writing incremented data to the data pointer.

9. A memory chip claimed in claim 7 further including an address decoder selectively receiving an outut of an data latch or the output of the data pointer so as to output a decoded address data to the memory.

10. A microcomputer comprising a microprocessor chip supplying an address information and generating an address latch enable signal, a write signal, and an address source selection signal, and a memory chip coupled to the microprocessor chip, the memory chip including a memory for storing various processing data, a bus interface coupled to the microprocessor for receiving the address information and the address latch enable signal, the write signal, and the address source selection signal, and for designating an address information of the memory to be accessed for a data writing, an address latch coupled to the bus interface for temporarily holding the address information from the bus interface in response to the address latch enable signal and so as to supply the address information to the memory, and an automatically updated data pointer coupled to the bus interface so that an initial value is set with the address information supplied from the bus interface, the data pointer operating to supply the address information to the memory, the address latch and the data pointer being controlled by the address source selection signal in such a manner that in case of individually designating an address for each item of data to be transferred, the address latch is used to supply the address information to the memory so that an address is given to the address latch by the bus interface for each data transfer of one unitary data and a given data is written to the memory in response to a write signal, and in a case of continuously designating an address for each item of data to be transferred, an address for a data transfer of a first unitary data to be transferred is given to the data pointer and then the data pointer is automatically updated for each of second and succeeding data transfers, so that the data pointer is used to sequentially supply the address information to the memory and a series of a given data is sequentially written to the memory in response to each write signal.

* * * * *